United States Patent
Peyresoubes et al.

(10) Patent No.: US 8,432,220 B2
(45) Date of Patent: Apr. 30, 2013

(54) LINEARIZATION DEVICE FOR A POWER AMPLIFIER

(75) Inventors: Georges Peyresoubes, Cholet (FR); Bruno Feuvrie, Nantes (FR); Mazen Abi Hussein, Nantes (FR); Yide Wang, Nantes (FR)

(73) Assignees: Thales, Neuilly sur Seine (FR); Universite de Nantes, Nantes Cedex (FR)

( * ) Notice: Subject to any disclaimer, the term of this patent is extended or adjusted under 35 U.S.C. 154(b) by 66 days.

(21) Appl. No.: 12/976,742

(22) Filed: Dec. 22, 2010

(65) Prior Publication Data

US 2012/0007672 A1    Jan. 12, 2012

(30) Foreign Application Priority Data

Dec. 23, 2009 (FR) .................................. 09 06280

(51) Int. Cl.
*H03F 1/26* (2006.01)
(52) U.S. Cl.
USPC ......... 330/149; 455/114.3; 375/296; 375/297
(58) Field of Classification Search .................. 330/149; 375/296–297; 455/114.3
See application file for complete search history.

(56) References Cited

U.S. PATENT DOCUMENTS

| | | | |
|---|---|---|---|
| 6,141,390 A | 10/2000 | Cova | |
| 8,055,217 B2 * | 11/2011 | Ba et al. .................. | 455/114.3 |
| 2003/0063686 A1 | 4/2003 | Giardina et al. | |
| 2005/0253745 A1 | 11/2005 | Song et al. | |

FOREIGN PATENT DOCUMENTS

| | | |
|---|---|---|
| EP | 1 482 637 A1 | 12/2004 |
| WO | 2004/086607 A1 | 10/2004 |
| WO | 2008/078195 A2 | 7/2008 |

OTHER PUBLICATIONS

Sungchul Hong et al., "Weighted Polynomial Digital Predistortion for Low Memory Effect Doherty Power Amplifier", IEEE Transactions on Microwave Theory and Techniques, May 1, 2007, pp. 925-931, vol. 55, No. 5, IEEE Servi Center, Piscataway, NJ, US, XP011180977.

Mao-Ching Chiu et al., "Predistorter Based on Frequency Domain Estimation for Compensation Nonlinear Distortion in OFDM Systems", IEEE Transactions on Vehicular Technology, Mar. 1, 2008, pp. 882-892, vol. 1, No. 2, IEEE Service Center, Piscataway, NJ, US, XP011201939.

* cited by examiner

*Primary Examiner* — Robert Pascal
*Assistant Examiner* — Khiem Nguyen
(74) *Attorney, Agent, or Firm* — Baker & Hostetler LLP

(57) ABSTRACT

A linearization device for a power amplifier using adaptive digital baseband predistortion includes a pre-inverse block receiving a complex discretized input signal $\tilde{x}_e(n)$ and restoring a complex predistorted signal $\tilde{x}_p(n)$ at the power amplifier input. The pre-inverse block includes a first module and a second module receiving the modulus of the complex input signal $|\tilde{x}_e(n)|$ at the input whose value is included in an amplitude domain varying between two values 0 and $A_{max}$, the amplitude domain being split into a plurality of segments, the first module associating with each value of the complex input signal modulus $|\tilde{x}_e(n)|$ contained in a given segment, a set of several parameters defining a model implemented in the second module via a function $F_j$, the second module restoring a value $F_j(|\tilde{x}_e(n)|)$, the complex predistorted signal resulting from multiplying the complex input signal $\tilde{x}_e(n)$ by the value $F_j(|\tilde{x}_e(n)|)$.

6 Claims, 3 Drawing Sheets

LINEARIZATION DEVICE FOR A POWER AMPLIFIER

CROSS-REFERENCE TO RELATED APPLICATION

This application claims priority to foreign French patent application No. FR 0906280, filed on Dec. 23, 2009, the disclosure of which is incorporated by reference in its entirety.

FIELD OF THE INVENTION

The present invention relates to a linearization device for a power amplifier. It applies notably to the field of power amplifiers used in transmission chains of radio communication systems.

BACKGROUND

In the field of radio communications, signal transmission requires the use of power amplifiers, essential in transmission chains. The power amplifiers used in radio communications are generally non-linear; non-linearity phenomena are all the more present in that current power amplifiers operate in areas close to their saturation, with a view to optimizing their performance, input dynamics are significant, and variable envelope signals are increasingly used. The non-linear behaviour of power amplifiers notably generates phase and amplitude distortions on the transmitted signals, which notably generate spectral feedback outside the useful signal channel. Such spectral feedback is undesirable: first, the requirements demanded from radio communication devices, in terms of spectral efficiency, are increasingly severe, with the increasing variety of wireless communication devices. Standards define precise requirements in this regard. Secondly, spectral feedback has a negative influence on the correct operation of devices situated close to the system including a power amplifier. This is because a vehicle, for example, may be equipped with a large number of systems operating in relatively similar frequency ranges. Distortions may, for example, be characterized by the ratio between the power of the signal in the useful channel and the power of the signal generated by the distortions in the adjacent channels, this ratio being commonly referred to by the English abbreviation ACPR ("Adjacent Channel Power Ratio"); other characteristic values may also be used, such as the magnitude of the error vector, commonly referred to by the English abbreviation EVM ("Error Vector Magnitude").

Linearization of power amplifiers is a favoured solution for reducing non-linear distortion phenomena in the transmission chains of transmitters and increasing their performance. There are various techniques of linearizing power amplifiers known from the prior art. Among the various known techniques of linearization, adaptive digital baseband predistortion is one of the most efficient in terms of cost-effectiveness, thanks to digital implementation, offering accuracy and flexibility. This technique can be used to obtain very good linearity performances, which can be achieved with better power yields, as well as reduced complexity and cost compared with existing analogue techniques. Generally, predistortion techniques consist in transforming the signals upstream from the power amplifier, in order for the combination with the power amplifier to make the overall system linear. Thus, if a circuit performs this transformation, a perfect linearization is theoretically achievable, by placing this upstream from the power amplifier. Such a circuit is described as "pre-inverse" and is commonly called a "precompensator" or "predistorter".

There are various techniques for producing adaptive digital baseband predistortion. Each of them consists in transposing the radio frequency transmission signal at the power amplifier output into the baseband and digitizing its in-phase and quadrature components using an analogue-to-digital converter. The baseband samples are then processed in a special digital processor, with an identification algorithm which compares them with the samples corresponding to the reference input signal. The process of identifying the parameters of the precompensator is performed digitally and seeks to minimize the error between the power amplifier input and output. After a characteristic convergence time of the identification algorithm, the precompensator may operate as the exact pre-inverse of the equivalent baseband model of the power amplifier. The algorithm may, for example, be implemented in a specific integrated circuit of the "ASIC" type, whose English acronym corresponds to "Application-Specific Integrated Circuit", or in an "FPGA" ("Field Programmable Gate Array") type programmable circuit, or yet again in a digital processing processor, commonly referred to as a "DSP" ("Digital Signal Processor") in English.

More particularly, among the known techniques of adaptive digital baseband predistortion, two categories may be mentioned, based on two approaches to implementing the precompensator:

implementation using correspondence tables or "TC", stored in memories commonly referred to as "LUT" ("Look-Up Table") in English. This category is particularly suited to amplifiers whose memory effects are negligible.

implementation using parametric models. The range of parametric models in this type of application is vast: parametric models may be simple memoryless polynomial models, up to distinctly more complex models, such as Volterra series models and neural network models.

The precompensator is, for example, a digital processor which processes the complex envelope of the input signal, generally represented by its in-phase and quadrature components designated respectively by the letters I and Q, and sampled at a determined frequency; thus, the sample occurring at the precompensator input at a given instant is a complex value. In order to simultaneously correct the amplitude and phase distortions of the power amplifier, the amplitude and phase, or the real and imaginary parts of each complex value corresponding to an input sample, are adjusted.

The correspondence table technique offers the advantage of being simple to implement; however, this technique has the drawback of the relatively long convergence time. Furthermore, the use of large dimension tables may be required, necessitating storage memories that may be difficult to implement.

The implementation of parametric models considerably increases the complexity of the system and may cause problems of instability when the orders of polynomials employed are high, or even problems of non-convergence of algorithms.

SUMMARY OF THE INVENTION

The present invention at least overcomes the aforementioned drawbacks, by providing a power amplifier linearization device based on the technique of adaptive digital baseband predistortion, implementing calculations offering short convergence times, and not presenting any instability problems, even when complex mathematical models are used.

Another advantage of the present invention is that it does not require the use of large capacity memories.

Accordingly, the invention is a linearization device for a power amplifier using adaptive digital baseband predistortion including a pre-inverse block receiving a complex discretized input signal $\tilde{x}_e(n)$ and restoring a complex predistorted signal $\tilde{x}_p(n)$ at the power amplifier input, wherein the pre-inverse block includes a first module and a second module receiving the modulus of the complex input signal $|\tilde{x}_e(n)|$ at the input whose value is included in an amplitude domain varying between two minimum and maximum values, the amplitude domain being split into a plurality of segments, the first module including a correspondence table associating with each value of the complex input signal modulus contained in a given segment, a predefined set of a plurality of parameters defining a parametric model implemented in the second module via a function Fj, the second module restoring a value $F_j(|\tilde{x}_e(n)|)$, the complex predistorted signal resulting from multiplying the complex input signal $\tilde{x}_e(n)$ by the value $F_j(|\tilde{x}_e(n)|)$.

In one embodiment of the invention, each of said predefined sets of parameters for a given segment k can define the complex coefficients of a polynomial of order $P_k$.

In one mode of embodiment of the invention, the minimum amplitude $A_{min}$ being zero, the amplitude domain can be split into a number $N_{TCP}$ of segments of the same length $L_{seg}$ equal to the ratio of the maximum amplitude $A_{max}$ of the amplitude domain to the number of segments $A_{max}/N_{TCP}$, the segments of the amplitude domain then being intervals $[(j-1)L_{seg}, jL_{seg}]$, the correspondence table associating for each of the intervals a set of complex parameters $a_{j_1}, \ldots, a_{jP_j}$ corresponding to the coefficients of order $j_1, jP_j$ of the polynomial of order $P_j$.

In one embodiment of the invention, the identification of the pre-inverse block can be based on an indirect architecture formed by an identification block arranged in parallel with the power amplifier, the identification block identifying the sets of parameters for each segment of the amplitude domain of the complex input signal modulus $|\tilde{x}_e(n)|$ by minimizing the error between the input signal $\tilde{x}_p(n)$ and the output signal $\tilde{y}(n)$ of the power amplifier in at least one iteration.

In one embodiment of the invention, the identification block can include an attenuator attenuating the output signal $\tilde{y}(n)$ of the power amplifier by a gain $1/g_d$ equal to the inverse of the desired gain of the power amplifier, the attenuated complex signal $\tilde{z}(n)$ being applied at the input of a post-inverse block restoring a signal $\tilde{z}_p(n)$ at the output, an estimation block determining the identification parameters of the pre-inverse block from the difference between the input signal $\tilde{x}_p(n)$ of the power amplifier and the output signal $\tilde{z}_p(n)$ of the post-inverse block by minimizing the quadratic error using the least squares technique.

BRIEF DESCRIPTION OF THE DRAWINGS

Other characteristics and advantages of the invention will appear on reading the disclosure, given as an example, made with reference to the accompanying drawings which depict.

DETAILED DESCRIPTION

Figure 1:
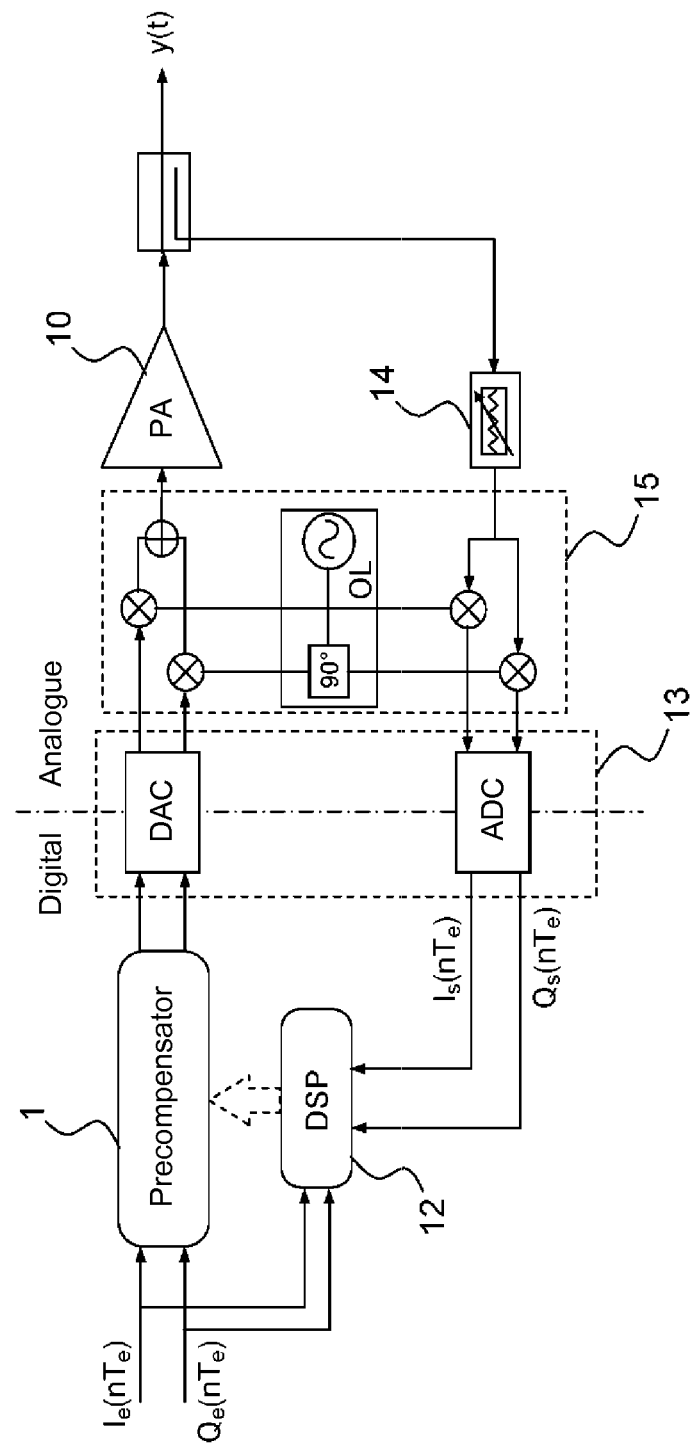
FIG. 1, the schematic diagram of a transmission chain including a power amplifier combined with a known adaptive digital baseband predistortion device.

FIG. 1, shows the schematic diagram of a transmission chain including a power amplifier combined with a known adaptive digital baseband predistortion device.

A transmission chain known in itself from prior art, for transmitting a phase and amplitude modulated radio frequency signal for example, may include a power amplifier 10 restoring an amplified signal y(t). The digitized input signal may be in baseband, for example after shaping by a low-pass filter achieved by a transmission filter not shown in the figure, then broken down into in-phase and quadrature components $I_e(nT_e)$ and $Q_e(nT_e)$, $T_e$ being the inverse of the signal sampling frequency. The components $I_e(nT_e)$ and $Q_e(nT_e)$ are applied at the input of a precompensator 11, restoring after processing of the two input signals, two digital output signals.

In parallel, the I and Q components are applied at the input of a digital signal processing module DSP 12.

A conversion block 13 includes a digital-to-analogue converter DAC and an analogue-to-digital converter ADC. The digital output signals of the precompensator 11 are converted into analogue signals by the DAC of the conversion block 13. An I/Q modulation/demodulation block 15 includes an I/Q modulator and an I/Q demodulator. The output signals of the precompensator 11, after conversion into analogue signals, are modulated by the I/Q modulator of the I/Q modulation/demodulation block 15; the resulting signal drives the input of the power amplifier 10. The power amplifier 10 output signal y(t) is taken and applied to the DSP input 12, after demodulation by the I/Q demodulator of the I/Q modulation/demodulation block 15, and conversion of the I and Q signals into digital signals $I_s(nT_e)$ and $Q_s(nT_e)$ by the ADC of the conversion block 13.

The baseband in-phase and quadrature components $I_s(nT_e)$ and $Q_s(nT_e)$ are thus processed in the DSP 12 with an identification algorithm comparing them with the corresponding samples of the in-phase and quadrature components of the reference input signal $I_e(nT_e)$ and $Q_e(nT_e)$. After convergence of the identification algorithm, configuration parameters corresponding to the inverse of the AM/AM and AM/PM characteristics are communicated to the precompensator 11, so that the latter may operate as the pre-inverse of the equivalent baseband model of the power amplifier 10.

A first known technique of implementing adaptive digital baseband predistortion is the correspondence table or LUT technique. This technique is the most used, and notably offers the advantage of being relatively simple to set up, while being particularly suited to power amplifiers whose memory effects are negligible, as for example in applications such as narrowband wireless communication systems. There are various methods of implementing correspondence tables.

A first known method of implementation is the so-called method of a correspondence precompensator, commonly termed a "mapping-predistorter" in English. According to this method, the input signal $x_e(t)=I_e(t)+jQ_e(t)$ representing the desired output of the power amplifier, is quantified over several bits for the real part and the imaginary part. Two correspondence tables are set up, each of them being two-dimensional, the Cartesian components of the input signal, $I_e(n)$ and $Q_e(n)$ acting as index values for both tables. The tables contain adjustment values $f_I(I_e, Q_e)$ and $f_Q(I_e, Q_e)$ which are then added to the input signal components. This first method of implementation achieves very good results, in so far as the memory effects of the power amplifier are negligible. However, the requirements in terms of storage and/or digital processing for initializing and adapting the tables, are very heavy. The large number of inputs causes a very slow convergence in the case where continuous adaptation is envisaged, i.e. when the precompensator parameters are adjusted continuously, for each new sample.

A second known method of implementation is the so-called method of the polar precompensator, commonly termed a "Polar distorter" in English. This method mainly consists in setting up two one-dimensional correspondence tables, that can be used to adjust the amplitude and phase of the input signal separately. It is, in fact, possible to use one-dimensional tables since the distortion in the power amplifier is essentially caused by the variation in the input signal amplitude. The correspondence tables can thus be indexed by the input signal amplitude. For example, a first table may be indexed by the amplitude of the input signal which contains just the real values of the amplitude adjustment. The output of this table may then be multiplied by the amplitude of the input signal and used to index a second table containing the phase adjustment values. The sizes of the tables used according to this second method are thus substantially smaller than in the case of the first method previously disclosed. However, one drawback of this second method lies in the fact that a rectangular-polar conversion is necessary, this conversion taking a major part of the total processing time.

A third known method of implementation is the so-called method of the constant gain precompensator, commonly termed a "constant-gain predistorter" in English. This method is widely used, and enables a considerable reduction in the size of the tables and processing time. This third method only requires the use of a single one-dimensional table indexed by the input signal amplitude, and consists in forcing the precompensator and the power amplifier to maintain a constant gain for all power levels. This is made possible by storing complex gain coefficients in Cartesian form (I/Q), being used to simultaneously adjust the I and Q components of the input signal. The convergence times and the size of the correspondence tables in memory can thus be considerably reduced. Advantageously, indexing functions can be developed in order to enable a better distribution of correspondence table inputs, with the aim of taking into account the characteristics of the power amplifier and the statistics of the signals deployed.

A second known technique of adaptive digital baseband predistortion consists in using mathematical models. Generally, in adaptive digital baseband predistortion applications, based on the simplifying assumption of finite memory with a memory duration Q, the relationship between the discretized complex envelope of the power amplifier output signal y(n) with respect to the complex envelope of the input signal (n) can be formulated via a multidimensional non-linear function $F_{NS}$, according to the following relationship:

$$\tilde{y}(n) = F_{NL}(\tilde{x}(n-Q), \tilde{x}^*(n-Q), \ldots, \tilde{x}(n-1), \tilde{x}^*(n-1), \tilde{x}(n), \tilde{x}^*(n)) \quad (1).$$

Thus, it should be noted that on the assumption that the memory effect of the power amplifier is negligible, its output signal can be formulated as a function of the input signal using a polynomial model.

The use of mathematical models can be tricky, since a given mathematical model can only be determined based on a limited number of power amplifier operating modes, notably in given environmental conditions whose variations in practice may make the mathematical model ineffective. Furthermore, determining the mathematical model is in itself difficult, and the algorithms can be difficult to implement.

Two particular forms of the function $F_{NL}$ are known from prior art, for modelling the behaviour of power amplifiers and/or their pre-inverses: the Volterra series or polynomial filters and neural networks.

Whatever the model adopted for the power amplifier, the whole difficulty lies in determining its pre-inverse, even trickier than direct modelling of the power amplifier. There are two methods of identification known from prior art: direct identification by inversion of a predefined model of the power amplifier, and indirect identification, consisting in determining the post-inverse of the power amplifier, for determining the configuration to apply to the pre-inverse.

Figure 2:
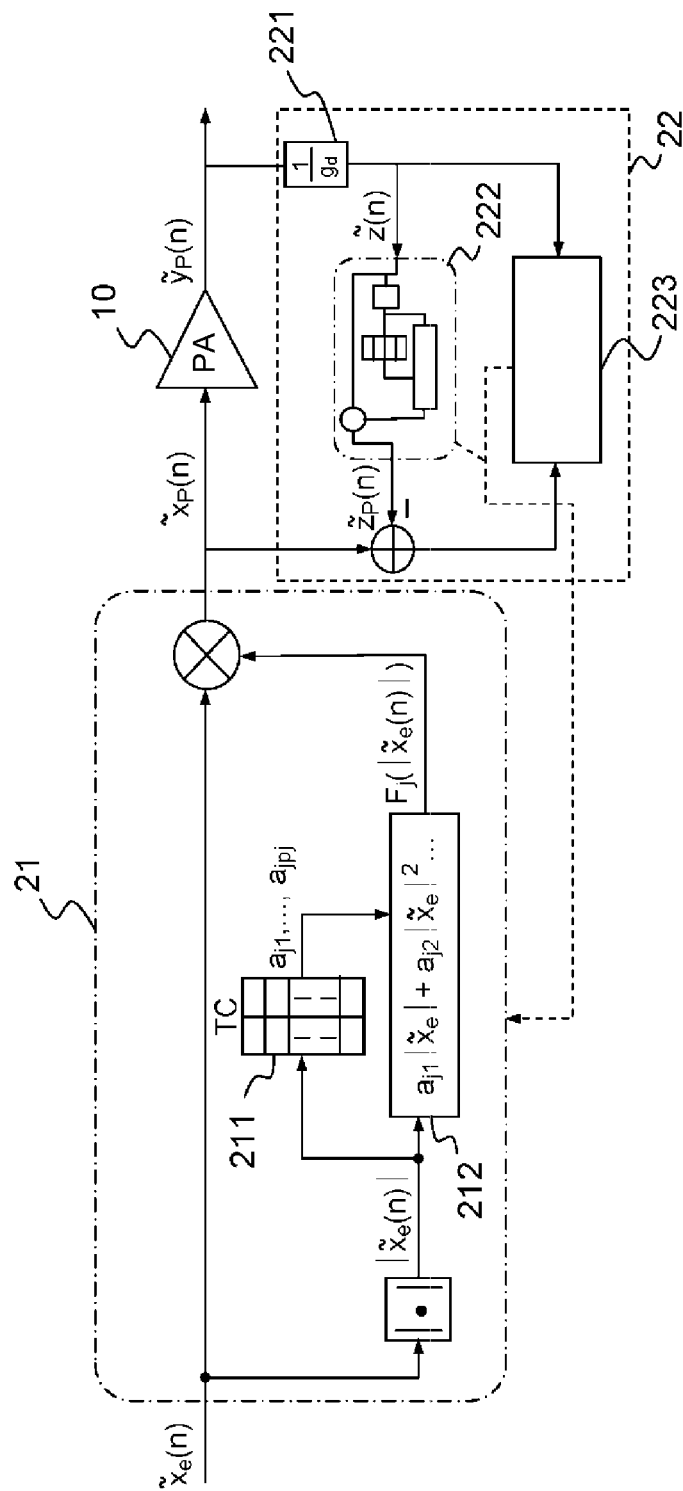
FIG. 2, the schematic diagram of the amplification block of a transmission chain including a power amplifier combined with a linearization device according to a mode of embodiment of the present invention.

FIG. 2 shows the schematic diagram of the amplification block of a transmission chain including a power amplifier combined with a linearization device according to an embodiment of the present invention.

An amplification block of a transmission chain includes the power amplifier 10, a pre-inverse block 21 receiving a digitized signal at the input represented by its complex envelope $\tilde{x}_e(n)$ and restoring a signal $\tilde{x}_p(n)$ at the output driving the input of the power amplifier 10, the latter restoring the amplified signal represented by its complex envelope $\tilde{y}(n)$. In the example illustrated by FIG. 2, in which a precompensator identification technique based on an indirect architecture is used, an identification block 22 is arranged in parallel with the power amplifier 10.

The pre-inverse block 21 includes a correspondence table module TC 211 and a parametric model module 212, both modules 211, 212 receiving the modulus of the complex input signal $|\tilde{x}_e(n)|$ at the input. The parametric model module 212 restores a signal $F_j(|\tilde{x}_e(n)|)$ as a function of the modulus of the complex input signal $|\tilde{x}_e(n)|$ and configuration parameters $a_{j1}$, $a_{jP_j}$ restored by the module TC 211. The output signal $\tilde{x}_p(n)$ of the pre-inverse block 21 is the multiplication of the complex input signal $\tilde{x}_e(n)$ by the output signal $F_j(|\tilde{x}_e(n)|)$ of the parametric model module 212.

The identification block 22 includes an attenuator 221 whose gain $1/g_d$ is the inverse of the desired gain $g_d$ of the power amplifier 10, a post-inverse block 222 receiving the normalized signal $\tilde{z}(n)$ at the input originating from the attenuation of the output signal $\tilde{y}(n)$ of the power amplifier 10 by the attenuator 221. The post-inverse block restores a signal $\tilde{z}_p(n)$ at its output. The identification block 22 further includes a parameter estimation block 223. The estimation block 223 determines the identification parameters of the pre-inverse block 21, e.g. based on the difference between the signals $\tilde{z}_p(n)$ and $\tilde{x}_p(n)$, and the attenuated signal $\tilde{z}(n)$, as disclosed below.

In the example illustrated by the figure, where an identification technique of the pre-inverse block 21 based on an indirect architecture is used, the output of the power amplifier 10 normalized by the desired gain $g_d$ of the linearized amplifier, $\tilde{z}(n) = \tilde{y}(n)/g_d$, is applied at the input of the post-inverse block 222. The post-inverse block 222 may, for example, be modelled by a so-called "quasi-memoryless polynomial", known in itself from prior art. The quasi-memoryless polynomial model is the baseband equivalent of the polynomial model expressing the radio frequency output signal of a non-linear system as a function of the radio frequency input signal. The quasi-memoryless polynomial model expresses the complex envelope of the output signal as a function of that of the input signal. By considering, for example, the even and odd order terms, the complex envelope of the pre-inverse block 21 output signal, $\tilde{x}_p(n)$, the following relationship can be formulated:

$$\tilde{x}_p(n) = F(|\tilde{x}_e(n)|)\tilde{x}_e(n) \quad (2),$$

where $$F(|\tilde{x}_e(n)|) = \sum_{k=1}^{K} a_k |\tilde{x}_e(n)|^{k-1}$$

is the gain function of the precompensator, $a_1, \ldots a_K$ being the parameters of the model and K its order. It should be noted that the parameters $a_1, \ldots, a_K$ can take complex values, enabling amplitude and phase distortions to be corrected simultaneously. The identification technique based on an indirect architecture consists in first identifying the post-inverse of the power amplifier 10 having the same model as that of the pre-inverse block 21. The parameters, once determined, are copied into the pre-inverse block 21. According to the relationship (2) above, the output $\tilde{z}_p(n)$ of the post-inverse block 222 can be written according to the following relationship:

$$\tilde{z}_p(n) = \sum_{k=1}^{K} a_k |\tilde{z}(n)|^{k-1} \tilde{z}(n). \quad (3)$$

If the output of the linearized amplifier is equal to $g_d\tilde{x}_e(n)$, the input of the post-inverse block 222 becomes $\tilde{z}(n) = \tilde{x}_e(n)$. In this case, both the pre-inverse 21 and post-inverse 222 blocks are respectively the exact pre-inverse and post-inverse of the power amplifier 10. Thus, the output $\tilde{z}_p(n)$ of the post-inverse block 222 becomes equal to the input $\tilde{x}_p(n)$ of the power amplifier 10. Based on a set of input, $\{\tilde{x}_p(i)\}_{i=1}^{n}$, and output $\{\tilde{y}_p(i)\}_{i=1}^{n}$ samples of the power amplifier 10, it is possible to write the relationship (3) above:

$$z_p = Z\hat{a} \quad (4),$$

where $z_p = [\tilde{z}_p(1), \tilde{z}_p(2), \ldots, \tilde{z}_p(N)]^T = [\tilde{x}_p(1), \tilde{x}_p(2), \ldots, \tilde{x}_p(N)]^T$, and $$Z = [z, |z|z, \ldots, |z|^{K-1}z],$$

with $$z = [\tilde{z}(1), \tilde{z}(2), \ldots, \tilde{z}(N)]^T = \left[\frac{\tilde{y}(1)}{g_d}, \frac{\tilde{y}(2)}{g_d}, \ldots, \frac{\tilde{y}(N)}{g_d}\right]^T.$$

The parameters of the post-inverse block 222, which are identical to the parameters of the pre-inverse block 21, can then be estimated by minimizing the quadratic error $\|e(n)\|^2$, where $e(n) = \tilde{x}_p(n) - \tilde{z}_p(n)$. Thus, the vector of the parameters $\hat{a} = [a_1, a_2, \ldots, a_N]^T$ can be estimated by the least squares technique:

$$\hat{a} = (Z^H Z)^{-1} Z^H x_p \quad (5)$$

where $(.)^H$ is the conjugate transposition operator. Once these parameters are determined, they can be injected into the pre-inverse block 21, the system then being able to operate in an open loop. It is advantageously possible for the identification procedure to be reiterated several times, the input signal $\tilde{x}_e(n)$ first being used in place of $\tilde{x}_p(n)$.

In the present invention, the approach to implementation, hereafter referred to as TC/Parametric or TCP, is based on the use of a correspondence table implemented by the correspondence table module TC 211, and parametric models implemented by the parametric model module 212. According to one mode of embodiment, it is possible to split the amplitude domain of the input signal into a number $N_{TCP}$ of segments. In each of these segments, a parametric model can be identified for locally modelling the pre-inverse characteristics of the power amplifier 10.

The segmentation can be uniform, the segments then being of the same size and distributed uniformly over the input amplitude domain. Advantageously, the segmentation may be based on a change in detectable curvature of the characteristics: visually from the AM/AM and AM/PM characteristics of the power amplifier 10 or mathematically with the aid of the first or second derivatives of the characteristics. In the case of a uniform segmentation, assuming that the input signal amplitude varies between a minimum amplitude $A_{min}$ and a maximum amplitude $A_{max}$, the length $L_{seg}$ of each segment is equal to $$\frac{A_{max} - A_{min}}{N_{TCP}}.$$

On the assumption that the input signal amplitude varies between 0 and a maximum amplitude $A_{max}$, the length $L_{seg}$ of each segment is equal to $A_{max}/N_{TCP}$. Thus, for the j-th segment, a parametric model is identified for processing samples having amplitudes belonging to the $[(j-1)L_{seg}, jL_{seg}]$ interval. This technique rests on the assumption that the AM/AM and AM/PM pre-inverse characteristics of the power amplifier 10 have a monotonous polynomial form in each segment, typically of low order, as is usually the case in practice. The models used can be low order polynomial models or models of a similar nature, e.g. polynomial ratios, hyperbolic functions, etc.

The correspondence function $F_j(.)$ in the j-th segment can be expressed by the following relationship:

$$F_j(|\tilde{x}_e(n)|) = a_{j0} + a_{j1}|\tilde{x}_e(n)| + \ldots + a_{jP_j}|\tilde{x}_e(n)|^{P_j} \quad (6),$$

Or again:

$$F_j(|\tilde{x}_e(n)|) = \sum_{p=0}^{P_j} a_{jp} |\tilde{x}_e(n)|^p; \quad (7)$$

where $P_j$ is the order of the polynomial in the j-th segment and $a_{jp}$ its coefficients, p being a parameter varying between 0 and $P_j$ (in practice $P_j$ is, for example, chosen to be equal to 3 or less).

The amplitude domain of the normalized output signal $\tilde{z}(n) = \tilde{y}(n)/g_d$ of the power amplifier is first split into $N_{TCP}$ segments. The parameters $a_{jp}$, corresponding to the j-th segment, are then estimated from the samples of the signal $\tilde{z}(n)$ which belong to it, and the corresponding values of the gain function of the post-inverse of the power amplifier 10.

The latter are determined for each pair of input/output samples of the post-inverse block 222. The function $F_j(.)$ modelling the gain function of the post-inverse of the power amplifier 10, in the j-th segment, can be written, in a similar way, according to the following relationship:

$$F_j(|\tilde{z}(n)|) = \sum_{p=0}^{P_j} a_{jp}|\tilde{z}(n)|^p = \frac{\tilde{z}_p(n)}{\tilde{z}(n)}; \quad (8)$$

where $(\tilde{z}(n), \tilde{z}(n))$ is a pair of samples corresponding to the j-th segment. Since the function $F_j(.)$ has complex values, the same applies to the $a_{jp}$ parameters identified. This enables simultaneous amplitude and phase correction.

For a number $N_j$ of samples in the j-th segment, it is possible to denote the vector of samples at the input of the post-inverse block by $z_j=[\tilde{y}(1)/g_d, \ldots, \tilde{y}(N_j)/g_d]^T$, and that of the corresponding values of the function $F_j(.)$ by $f_j = [F_j(|\tilde{z}(1)|), \ldots, F_j(|\tilde{z}(N_j)|)]^T$.

It is then possible to formulate the least squares solution which minimizes the mean square error in each segment according to the following relationship:

$$\hat{a}_j = (A_j^H A_j)^{-1} A_j^H f_j;$$

where $\hat{a}_j = [a_{j0}, \ldots, a_{jP_j}]^T$ and $A_j = [1, |z_j|, \ldots, |z_j|^{P_j}]$. It should be noted that $\tilde{z}_p(n)$ is replaced by $\tilde{x}_p(n)$ in the identification procedure, and therefore by $\tilde{x}_e(n)$ for the first iteration.

Figure 3B:
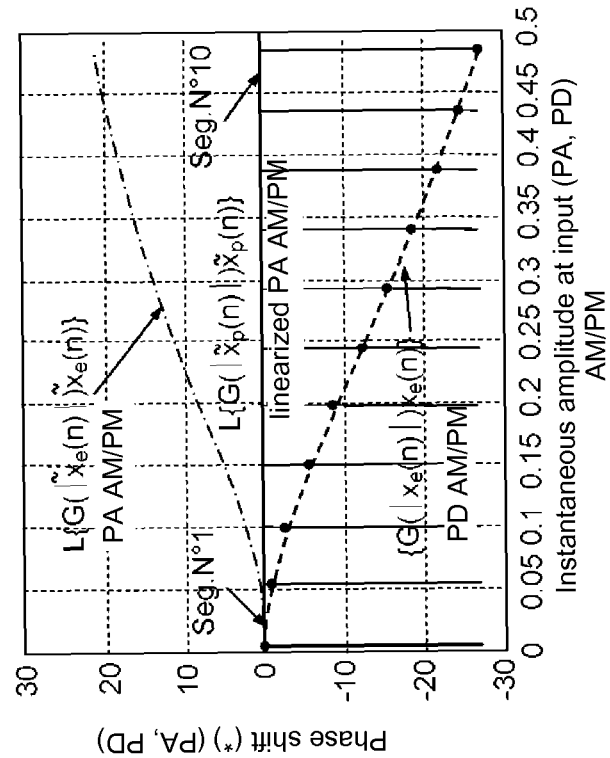
FIGS. 3a and 3b, curves representing the AM/AM and AM/PM characteristics, respectively, of the power amplifier, the precompensator and the overall system.
Figure 3A:
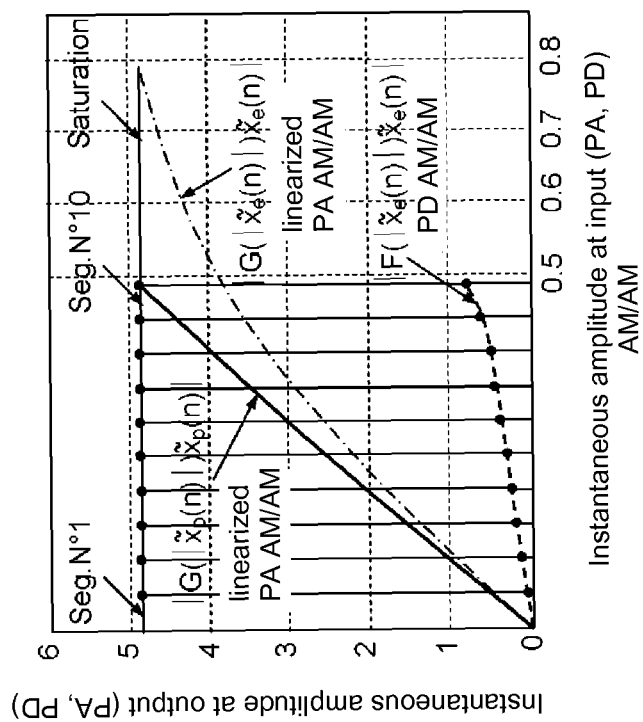

FIGS. 3a and 3b show the AM/AM and AM/PM characteristics, respectively, of the power amplifier, the precompensator and the overall system.

The curves shown in FIGS. 3a and 3b are representations respectively of the instantaneous output amplitude as a function of the AM/AM instantaneous input amplitude, and of the phase shift between the input and output signals as a function of the AM/PM instantaneous input amplitude, for a power amplifier modelled by a Saleh quasi-memoryless model—whose characteristic coefficients are chosen in the following way: $\alpha_a=10$, $\beta_a=1$, $\alpha_\phi=5$, $\beta_\phi=9$—of the corresponding precompensator and the linearized amplifier, for a number of segments $N_{TCP}=10$ and order 2 polynomials, that is: $P_j=2$ and $j=1, 2, \ldots, 10$. The Saleh model is commonly used for modelling amplifiers with a weak memory effect. It is recalled here that if a Saleh quasi-memoryless model is chosen as the baseband equivalent of the power amplifier 10, then the output signal $\tilde{y}(n)$ of the power amplifier can be expressed as a function of the input signal $\tilde{x}_e(n)$ according to the following relationship:

$$\tilde{y}(n) = G(|\tilde{x}_e(n)|)\tilde{x}_e(n) \quad (9);$$

where $$G(|\tilde{x}_e(n)|) = \frac{\alpha_a}{1+\beta_a|\tilde{x}_e(n)|^2} \exp\left(j\frac{\alpha_\phi|\tilde{x}_e(n)|^2}{1+\beta_\phi|\tilde{x}_e(n)|^2}\right)$$

is the complex gain of the power amplifier 10, and the parameters $\alpha_a$, $\beta_a$, $\alpha_\phi$, $\beta_\phi$ can be adjusted suitably for approximating the real characteristics of the power amplifier 10. The graphical representation in FIG. 3a, includes a first curve shown as a thin dot-dash line representing, as a function of the instantaneous amplitude of the input signal $|\tilde{x}_e(n)|$, the variation in the instantaneous amplitude of the non-linearized power amplifier 10 output signal, i.e. $|G(|\tilde{x}_e(n)|)\tilde{x}_e(n)|$, a second curve shown as a dotted line representing the variation in instantaneous amplitude of the predistorted signal at the output of the pre-inverse block 21, i.e. $|F(|\tilde{x}_e(n)|)\tilde{x}_e(n)|$ and a third curve shown as a solid line, representing the variation in instantaneous amplitude of the linearized power amplifier 10, i.e. $|G(|\tilde{x}_p(n)|)\tilde{x}_p(n)|$. In this example, since the amplitude domain of the input signal is from 0 to 0.5 V, the ten segments have a length of 0.05 V. For amplitudes beyond 0.5 V, the power amplifier operates in a saturation zone that cannot be exploited.

The graphical representation in FIG. 3b, includes a first curve shown as a thin dot-dash line representing, as a function of the instantaneous amplitude of the input signal $|\tilde{x}_e(n)|$, the variation in the instantaneous phase shift of the non-linearized power amplifier 10 output signal, i.e. $|G(|\tilde{x}_e(n)|)\tilde{x}_e(n)|$, a second curve shown as a dotted line representing the variation in instantaneous phase shift of the predistorted signal at the output of the pre-inverse block 21, i.e. $|F(|\tilde{x}_e(n)|)\tilde{x}_e(n)|$ and a third curve shown as a solid line, representing the variation in instantaneous phase shift of the linearized power amplifier 10, i.e. $|G(|\tilde{x}_p(n)|)\tilde{x}_p(n)|$.

It should be noted that the order of the polynomials may vary from one segment to another, and this may advantageously be used in practice so as to optimize the assembly.

The invention claimed is:

1. A linearization device for a power amplifier using adaptive digital baseband predistortion, the linearization device comprising:
a pre-inverse block receiving a complex discretized input signal $\tilde{x}_e(n)$ and restoring a complex predistorted signal $\tilde{x}_p(n)$ at an input of the power amplifier, wherein the pre-inverse block includes a first module and a second module receiving a modulus of the complex discretized input signal $|\tilde{x}_e(n)|$ at the input whose value is included in an amplitude domain varying between two minimum and maximum values $A_{min}$ and $A_{max}$, the amplitude domain being split into a plurality of segments, the first module including a correspondence table associating with each value of the modulus of the complex discretized input signal $|\tilde{x}_e(n)|$ contained in a given segment, a predefined set of a plurality of parameters defining a parametric model implemented in the second module via a function Fj, the second module restoring a value $F_j|\tilde{x}_e(n)|$, the complex predistorted signal resulting from multiplying the complex discretized input signal $\tilde{x}_p(n)$ by the value $F_j(|\tilde{x}_e(n)|)$, an identification of the pre-inverse block being based on an indirect architecture formed by an identification block arranged in parallel with the power amplifier, the identification block identifying the predefined set of the plurality of parameters for each segment of the amplitude domain of the modulus of the complex discretized input signal $|\tilde{x}_e(n)|$ by minimizing an error between the complex predistorted signal $\tilde{x}_p(n)$ and an output signal $\tilde{y}(n)$ of the power amplifier in at least one iteration.

2. The linearization device for the power amplifier according to claim 1, wherein each of said predefined sets of the plurality of parameters for a given segment designated by an index k, k being an non-null integer that defines complex coefficients of a polynomial of order $P_k$.

3. The linearization device for the power amplifier according to claim 2, wherein the minimum amplitude $A_{min}$ being zero, the amplitude domain is split into a number $N_{TCP}$ of segments of same length $L_{seg}$ equal to a ratio of the maximum amplitude of the amplitude domain to the number of segments $A_{max}/N_{TCP}$, the segments of the amplitude domain then being intervals designated $[(j-1)L_{seg}, jL_{seg}]$, $j-\{1,2,\ldots,NTCP\}$ the correspondence table associating for each of the intervals a set of complex parameters denoted $a_{j1}, \ldots, a_{jP_j}, j_1, \ldots, j_{Pj}$ being integers corresponding to the coefficients of order $j_1, \ldots, j_{Pj}$ of the polynomial of order $P_j$.

4. The linearization device for the power amplifier according to claim 1, wherein the identification block includes an attenuator attenuating the output signal ỹ(n) of the power amplifier by a gain denoted $1/g_d$ equal to an inverse of the desired gain gd of the power amplifier, an attenuated complex signal z̃(n) being applied at the input of a post-inverse block restoring a signal $z̃_p$ (n) at the output, an estimation block determining the identification parameters of the pre-inverse block from the difference between the input signal $x̃_p$ (n) of the power amplifier and the output signal $z̃_p$ (n) of the post-inverse block by minimizing the quadratic error using the least squares technique.

5. The linearization device for the power amplifier according to claim 4, wherein the identification block includes an attenuator attenuating the output signal ỹ(n) of the power amplifier by a gain $1/g_d$ equal to the inverse of the desired gain of the power amplifier, the attenuated complex signal z̃(n) being applied at the input of a post-inverse block restoring a signal $z̃_p$ (n) at the output, an estimation block determining the identification parameters of the pre-inverse block from a difference between the complex predistorted signal $x̃_p$ (n) of the power amplifier and the output signal $z̃_p$ (n) of the post-inverse block by minimizing a quadratic error using the least squares technique.

6. The linearization device for the power amplifier according to claim 3, wherein the identification block includes an attenuator attenuating the output signal ỹ(n) of the power amplifier by a gain $1/g_d$ equal to an inverse of the desired gain of the power amplifier, an attenuated complex signal z̃(n) being applied at the input of a post-inverse block restoring a signal $z̃_p$ (n) at the output, an estimation block determining the identification parameters of the pre-inverse block from the difference between the input signal $x̃_p$ (n) of the power amplifier and the output signal $z̃_p$ (n) of the post-inverse block by minimizing the quadratic error using the least squares technique.

\* \* \* \* \*